United States Patent [19]

Daniel, Jr.

[11] 4,270,221
[45] May 26, 1981

[54] PHASELOCKED RECEIVER WITH ORDERWIRE CHANNEL

[75] Inventor: James W. Daniel, Jr., Cherry Hill, N.J.

[73] Assignee: RCA Corporation, New York, N.Y.

[21] Appl. No.: 85,548

[22] Filed: Oct. 17, 1979

[51] Int. Cl.³ .............................................. H04B 1/16
[52] U.S. Cl. ...................................... 455/208; 375/81; 455/260; 455/265; 329/124
[58] Field of Search .................. 375/81; 455/208, 214, 455/216, 260, 265, 266, 43; 329/50, 124

[56] References Cited

U.S. PATENT DOCUMENTS 3,745,255  7/1973  Fletcher et al. ...................... 455/260
3,909,735  9/1975  Anderson et al. ................... 455/208
4,053,834  10/1977  Lerner ..................................... 455/43

Primary Examiner—Jin F. Ng
Attorney, Agent, or Firm—Samuel Cohen; Carl V. Olson

[57] ABSTRACT

A radio receiver includes a phaselocked loop including a main phase detector which accomplishes both carrier extraction and demodulation of an FM orderwire signal. The loop bandwidth characteristic is made suitable for de-emphasis of the FM orderwire audio signal, and the output of a quadrature phase detector is applied as a divisor to an analog divider in the phaselocked loop to cause the bandwidth of the phaselocked loop to remain substantially constant despite changes in input signal level.

5 Claims, 5 Drawing Figures

CARRIER EXTRACTOR LOOP RESPONSE UNMODIFIED

RESPONSE OF DE-EMPHASIS NETWORK

RESPONSE OF CARRIER EXTRACTOR WITH FREQUENCY RESPONSE IDENTICAL TO DE-EMPHASIS NETWORK

PHASELOCKED RECEIVER WITH ORDERWIRE CHANNEL

This invention relates to phaselocked receivers or modems for receiving data and also an "orderwire" voice signal by which operators communicate schedules and other operating information. The received signal carrier may be phase shift keyed (PSK) with the data and also frequency modulated (FM) with the orderwire voice signal. The receivers are useful, for example, in systems of communications via satellites where pre-emphasis is employed at the transmitting point and de-emphasis is used at the receiving point.

An example of a receiver apparatus which can be improved by the incorporation therein of the present invention is a Model MD-945 TSC-85 (V) Modem, Digital Data, sold by RCA Corporation, Camden, N.J. The apparatus includes a phaselocked loop including a phase detector which is receptive to a received signal carrier and the output of a local voltage controlled crystal oscillator (VCXO), and which has an output signal applied to the control voltage input of the oscillator tending to make the oscillator output equal in frequency and phase to the received signal carrier. The output of the oscillator is an "extracted carrier" which is used in a demodulator to demodulate the frequency shift keyed data from the input signal. The output from the phase detector is also an audio voice signal obtained by demodulating the orderwire signal frequency modulated on the received carrier.

A phaselocked loop designed to have a sufficiently broad loop bandwidth for frequency detection of an orderwire signal may have too broad a loop bandwidth to simultaneously extract a carrier from a received signal having a low signal-to-noise (S/N) ratio, particularly when the data is quadrature phase shift keyed (QPSK) and the received signal must be multiplied in frequency by four to remove the data before being applied to the phase detector in the carrier extractor phaselocked loop.

In accordance with the present invention, an improved phaselocked loop is constructed to have a narrower bandwidth designed to accomplish demodulation of the FM orderwire signal, and de-emphasis of the demodulated FM orderwire signal, as well as carrier extraction of received signals having a low S/N ratio.

Figure 1:
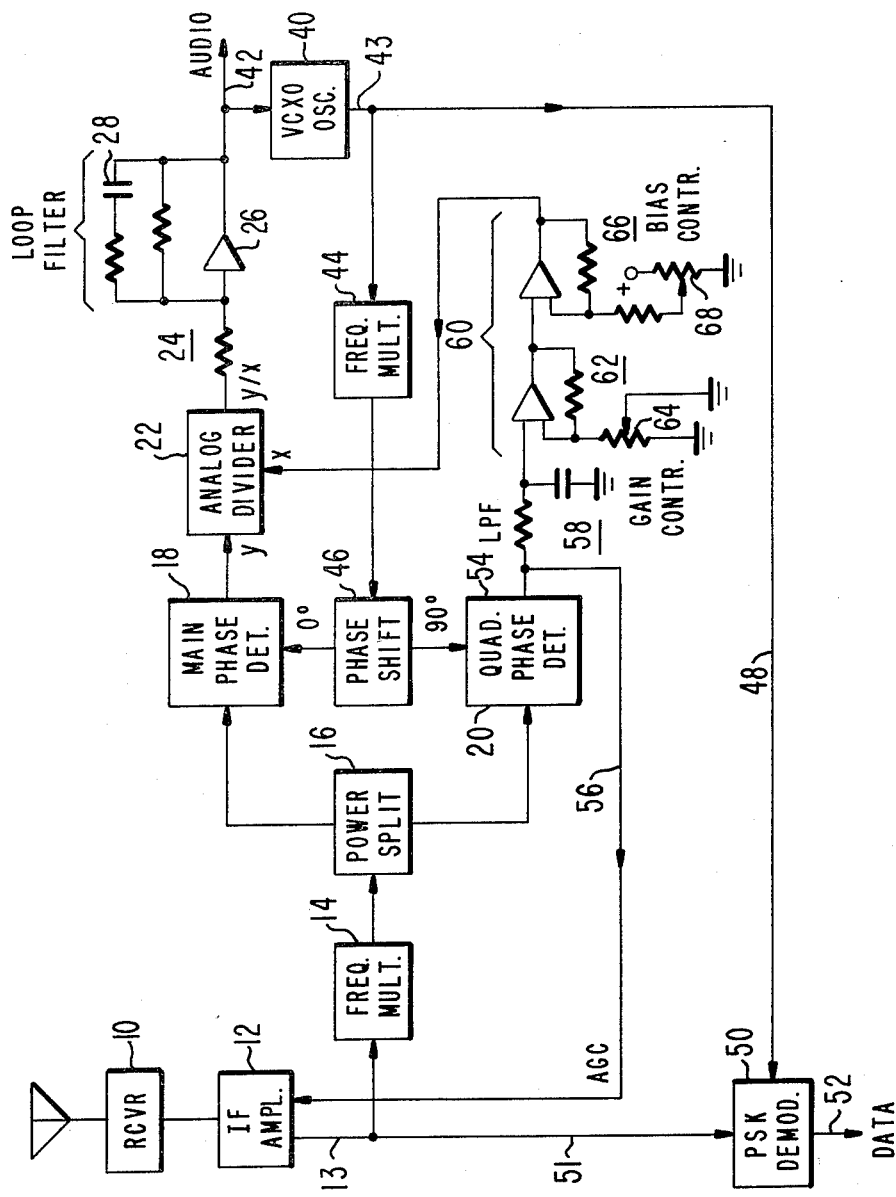
FIG. 1 is a schematic diagram of a receiver constructed according to the teachings of the invention.

Referring in more detail to FIG. 1, an intermediate-frequency signal from a source 10 is coupled to an intermediate-frequency amplifier 12. The source 10 may be a radio-frequency signal receiver, and the amplifier 12 may be in the modem part of the receiver. The intermediate-frequency signal at 13, which may be in the 70 MHz range, is frequency multiplied by four at 14 to 280 MHz and applied to a power splitter 16. Half the power is applied to a main phase detector 18 and the other half is applied to a quadrature phase detector 20.

The output of the main phase detector 18 is applied to the y input of a signal attenuator in the form of an analog divider 22, which may be a model AD535JD unit made by Analog Devices, Inc. The output of the divider is applied to a phaselocked loop filter 24 including an operational amplifier 26 with a feedback circuit 28. The output of the filter is a voltage control signal applied to a voltage controlled crystal oscillator (VCXO) 40, and is an audio orderwire signal which is demodulated from the received signal and which is directed along path 42 to suitable audio reproducing means.

The output 43 of the local oscillator 40 is applied through a four-times frequency multiplier 44, like multiplier 14, to a phase shifter 46 which supplied 0-degree and 90-degree phase shifted versions of the frequency multiplied local oscillations to the main and quadrature phase shifters 18 and 20, respectively. The units 18, 22, 24, 40, 44 and 46 are seen to constitute a phaselocked loop by which the phase of the oscillator 40 is locked to the phase of the IF signal received at 10.

The output 43 of oscillator 40 is applied over path 48 to a demodulator 50 for the phase shift keyed signal received over path 51 from the IF amplifier 12. Demodulated data signals at 52 are applied to data processing circuits (not shown). In the example being described, the received signal is quadrature phase shift keyed (QPSK), and the frequency multiplier 14 multiplies the frequencies of the received IF signal by four to remove the QPSK modulation thereon for carrier extraction purposes. If the received signal is binary phase shift keyed (BPSK), the frequency multipliers 14 and 44 multiply by two, instead of four. If the received signal is a modulated continuous wave, the multipliers 14 and 44 are omitted.

The output 54 from the quadrature phase detector is applied over path 56 as an automatic gain control (AGC) signal to the IF amplifier 12, and is applied through a low-pass filter 58 and an amplifier circuit 60 to the x input of analog divider 22 in the phaselocked loop. The circuit 60 includes a wide-band adjustable-gain amplifier 62 including a potentiometer 64, and a biasing circuit 66 including a potentiometer 68. The biasing circuit 66 keeps the signal applied to the divider 22 at positive values well removed from zero volts, and not less than one, to avoid the perturbations which result from trying to divide by a value near zero.

Figure 2:
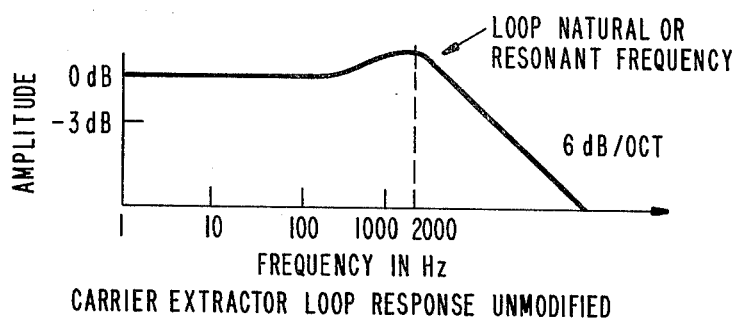
FIG. 2 is a chart showing a phaselocked loop bandwidth which is too wide for carrier extraction from signals of low signal-to-noise ratio.

In the operation of the modem portion of a receiver shown in FIG. 1, the received IF signal is frequency multiplied at 14 to remove the phase shift keyed modulation therefrom and then is applied to the phaselocked loop 18, 22, 24, 40, 44 and 46. The output 43 of the oscillator 40 is an extracted carrier wave which is used in the demodulator 50 to demodulate the phase shift keyed data from the received IF signal. If the analog divider 22 is not operated to attenuate the output from the main phase detector, and if the loop filter 24 is constructed to provide the usual loop bandwidth characteristic as shown in FIG. 2, then the system operates to provide properly demodulated orderwire voice signals at 42 and data signals at 52, when the received signal has a sufficiently high signal-to-noise ratio. However, if the signal-to-noise ratio is low, the bandwidth characteristic should be narrower than shown in FIG. 2 to satisfactorily extract the carrier and demodulate the data information from the received signal.

Figure 3:
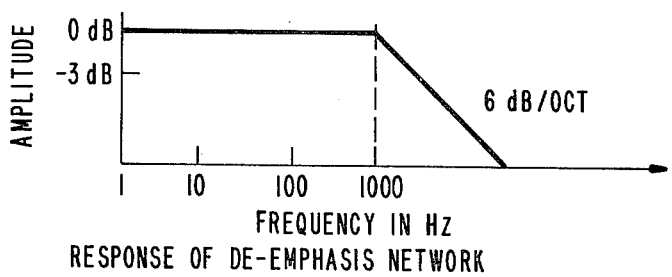
FIG. 3 is a chart showing a frequency response characteristic suitable for performing de-emphasis on an FM orderwire signal.
Figure 4:
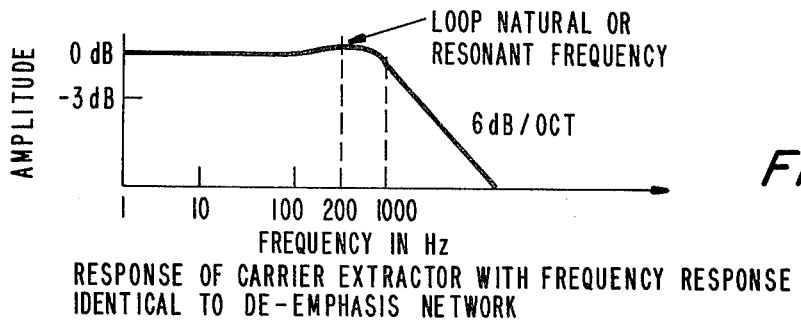
FIG. 4 is a chart showing a phaselocked loop frequency response characteristic which is suitable for both carrier extraction and demodulation with de-emphasis of an FM orderwire signal.

According to the invention, use is made of the fact that the received signals customarily are given a pre-emphasis of high frequency components at the transmitting point and require a corrective de-emphasis of high frequency components at the receiving point. Therefore, the de-emphasis function, which is normally accomplished in audio circuits following the output 42 of the phaselocked loop, can be accomplished in the phaselocked loop itself by designing the loop filter 24 to have the de-emphasis characteristic shown in FIG. 3, rather than as shown in FIG. 2. This characteristic is also suitably narrow in bandwidth for carrier extraction from received signals of low signal-to-noise ratio. Accordingly, the loop filter 24 is constructed to have the characteristic shown in FIG. 4 so that the phaselocked loop is well suited for carrier extraction from weak received signals and for demodulation of FM orderwire audio signals from the received signals.

Figure 5:
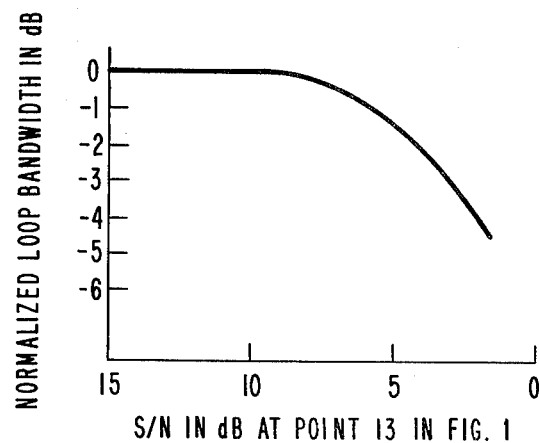
FIG. 5 is a diagram which will be referred to in describing the operation of circuits in FIG. 1.

However, a phaselocked loop has a bandwidth which varies with input signal-to-noise ratio, as shown in FIG. 5, where normalized loop bandwidth in dB for the phaselocked loop of FIG. 1 vs. signal-to-noise ratio in dB at point 13 in FIG. 1. But the phaselocked loop bandwidth should be substantially constant if demodulation and de-emphasis of the orderwire audio signal is to be accomplished in the phaselocked loop. Therefore, according to the invention, the signal from the quadrature phase detector 20, which varies with input signal-to-noise ratio, is used to inversely control the gain of the variable attenuator 22 in the loop so that the loop bandwidth remains substantially constant despite changes in received signal-to-noise ratio. A large output from quadrature phase detector 54 causes a large attenuation in divider 22 of the signal from the main phase detector 18. A small output causes the opposite effect. The result is that the bandwidth of the phaselocked loop is maintained substantially constant to permit the demodulation of the orderwire audio signal.

The characteristics of the filter 58, circuit 60 and the divider 22 to which the output of circuit 60 is applied, are constructed and connected to provide an AGC loop around the main phase detector. The filtered output of the quadrature phase detector 20 is amplified by circuit 60 to provide a direct-current voltage which, when the loop is locked, represents the level of the input signal. This d-c voltage is applied as a divisor to the x input of analog divider 22, which receives a y input from the output of the main phase detector 18. The output y/x from the analog divider 22 is substantially constant, because x and y are substantially equal, and y divided by x is constant. The resulting AGC action keeps the loop bandwidth substantially constant, so that the orderwire audio signal is properly demodulated, and made available at 42 for application to a loudspeaker (not shown).

What is claimed is:

1. In a phaselocked radio receiver, a combination carrier extraction and FM orderwire de-emphasis system, comprising a phaselocked loop including a voltage controlled oscillator having an output constituting a carrier extracted from a received data signal for use in demodulating the received data signal, a main phase detector receptive to the received data signal and the output of said oscillator, and a signal path from the output of said main phase detector to the control input of said oscillator and to an orderwire audio output, said signal path including a loop filter constructed to have a de-emphasis characteristic for an orderwire audio signal, a quadrature phase detector receptive to the received data signal and a quadrature phase of the output of said oscillator and producing an output which varies with the signal-to-noise ratio of the received data signal, and means responsive to the output of said quadrature phase detector to make the bandwidth of said phaselocked loop remain substantially constant despite changes in the signal-to-noise ratio of the received data signal.

2. The combination of claim 1 wherein said means to make the bandwidth of the phaselocked loop constant comprises means to control the gain of said signal path from the main phase detector to the control input of the oscillator.

3. The combination of claim 2 wherein said means to control the gain of said signal path includes an analog divider in the signal path.

4. The combination of claim 2 wherein said means to control the gain of said signal path includes an amplifier receptive to the output of said quadrature phase detector.

5. The combination of claim 2 wherein said means to control the gain of said signal path comprises an analog divider in the signal path, and an amplifier receptive to the output of the quadrature phase detector and having an output coupled to the divisor input of the divider.

* * * * *